(12) United States Patent
Je et al.

(10) Patent No.: US 11,242,601 B2
(45) Date of Patent: Feb. 8, 2022

(54) SHOWERHEAD AND SUBSTRATE PROCESSING APPARATUS INCLUDING THE SAME

(71) Applicant: EUGENE TECHNOLOGY CO., LTD., Yongin-si (KR)

(72) Inventors: Sung Tae Je, Yongin-si (KR); Chan Yong Park, Icheon-si (KR); Jae Ho Lee, Yongin-si (KR); Gil Sun Jang, Icheon-si (KR); Chang Hoon Yun, Yongin-si (KR); Han June Lim, Yongin-si (KR); Woo Young Kang, Uijeongbu-si (KR)

(73) Assignee: EUGENE TECHNOLOGY CO., LTD., Yongin-si (KR)

( * ) Notice: Subject to any disclaimer, the term of this patent is extended or adjusted under 35 U.S.C. 154(b) by 48 days.

(21) Appl. No.: 16/652,027

(22) PCT Filed: Sep. 7, 2018

(86) PCT No.: PCT/KR2018/010493
§ 371 (c)(1),
(2) Date: Mar. 27, 2020

(87) PCT Pub. No.: WO2019/066299
PCT Pub. Date: Apr. 4, 2019

(65) Prior Publication Data
US 2020/0263303 A1 Aug. 20, 2020

(30) Foreign Application Priority Data
Sep. 28, 2017 (KR) .................. 10-2017-0125830

(51) Int. Cl.
*C23C 16/46* (2006.01)
*C23C 16/455* (2006.01)
*C23C 16/458* (2006.01)

(52) U.S. Cl.
CPC .......... *C23C 16/46* (2013.01); *C23C 16/4583* (2013.01); *C23C 16/45565* (2013.01)

(58) Field of Classification Search
CPC .............. C23C 16/455; C23C 16/4412; C23C 16/45565; C23C 16/45563
See application file for complete search history.

(56) References Cited

U.S. PATENT DOCUMENTS 7,737,035 B1 * 6/2010 Lind .................. C23C 16/4409
438/680
9,490,149 B2 11/2016 Chandrasekharan et al.
(Continued)

FOREIGN PATENT DOCUMENTS

KR 1020080022699 A 3/2008
KR 101027952 B1 4/2011
(Continued)

*Primary Examiner* — Joseph A Miller, Jr.
(74) *Attorney, Agent, or Firm* — Rabin & Berdo, P.C.

(57) ABSTRACT

According to an embodiment of the present invention, a substrate processing apparatus includes: a chamber in which a process for a substrate is performed; a showerhead installed in the chamber to inject a reaction gas toward the substrate; and a susceptor installed below the showerhead to support the substrate. Here, the showerhead includes: a showerhead main body including an inner space to which the reaction gas is supplied from the outside and a plurality of injection holes configured to inject the reaction gas while communicating with the inner space; an inflow plate installed in the inner space to divide the inner space into an inflow space and a buffer space and including a plurality of inflow holes configured to allow the inflow space and the buffer space to communicate with each other; and a plurality of adjustment plates installed on the inflow holes in a movable manner, respectively, and configured to restrict movement of the reaction gas from the inflow space to the buffer space.

10 Claims, 7 Drawing Sheets

(56) References Cited

U.S. PATENT DOCUMENTS

| | | | |
|---|---|---|---|
| 2009/0277587 A1* | 11/2009 | Lubomirsky | C23C 16/45574 156/345.34 |
| 2010/0136216 A1* | 6/2010 | Tsuei | H01L 31/1824 427/9 |
| 2016/0289831 A1 | 10/2016 | Je et al. | |
| 2017/0009348 A1 | 1/2017 | Chandrasekharan et al. | |

FOREIGN PATENT DOCUMENTS

| | | |
|---|---|---|
| KR | 101028407 B1 | 4/2011 |
| KR | 1020150004771 A | 1/2015 |
| KR | 101560623 B1 | 10/2015 |

\* cited by examiner

SHOWERHEAD AND SUBSTRATE PROCESSING APPARATUS INCLUDING THE SAME

TECHNICAL FIELD

The present invention relates to a showerhead and a substrate processing apparatus, and more particularly, to a showerhead, which may move a plurality of adjustment plates to restrict movement of a reaction gas, and a substrate processing apparatus.

BACKGROUND ART

A semiconductor apparatus includes a plurality of layers on a silicon substrate. Here, the layers may be deposited on the substrate through a deposition process. The deposition process has several important issues that are important to evaluate the deposited layers and select a deposition method.

First, one example of the important issues is 'quality' of each of the deposited layers. The 'quality' represents composition, contamination levels, defect density, and mechanical and electrical properties. The composition of the deposited layer may be changed according to deposition conditions. This is very important to obtain a specific composition.

Second, another example of the issues is a uniform thickness over a wafer. Particularly, a thickness of a layer deposited on a nonplanar shaped pattern having a stepped portion is extremely important. Here, whether the thickness of the deposited layer is uniform may be determined through a step coverage which is defined as a ratio obtained by dividing a minimum thickness of a layer deposited on the stepped portion by a thickness of a layer deposited on the pattern.

Another issue related to the deposition is filling space. The filling space may include gap filling, which fills an insulating layer including an oxide layer between metal lines. A gap is provided to physically and electrically isolate the metal lines from each other.

Among the issues, uniformity is one of the important issues related to the deposition process. A non-uniform layer may cause high electrical resistance on the metal lines to increase possibility of mechanical damage.

DISCLOSURE

Technical Problem

The present invention provides a showerhead capable of adjusting a supply amount of a reaction gas for each portion of a substrate by operating an adjustment plate and a substrate processing apparatus.

The present invention also provides a showerhead capable of easily adjusting process uniformity and a substrate processing apparatus.

Further another object of the present invention will become evident with reference to following detailed descriptions and accompanying drawings.

Technical Solution

An embodiment of the present invention provides a substrate processing apparatus including: a chamber in which a process for a substrate is performed; a showerhead installed in the chamber to inject a reaction gas toward the substrate; and a susceptor installed below the showerhead to support the substrate. Here, the showerhead includes: a showerhead main body including an inner space to which the reaction gas is supplied from the outside and a plurality of injection holes configured to inject the reaction gas while communicating with the inner space; an inflow plate installed in the inner space to divide the inner space into an inflow space and a buffer space and including a plurality of inflow holes configured to allow the inflow space and the buffer space to communicate with each other; and a plurality of adjustment plates installed on the inflow holes in a movable manner, respectively, and configured to restrict movement of the reaction gas from the inflow space to the buffer space.

In an embodiment, the inflow plate may include a guide hole defined in at least one or more of both sides of the inflow hole, and the adjustment plate may include a guide bar that is inserted into the guide hole while protruding from one surface opposite to the inflow plate and movable along the guide hole when the adjustment plate is moved.

In an embodiment, the substrate processing apparatus may further include a plurality of electromagnets each configured to apply a magnetic force to the adjustment plate to move the adjustment plate.

In an embodiment, the chamber may include: a lower chamber having an opened upper portion; and an upper chamber installed on the showerhead to define the inner space and open and close the upper portion of the lower chamber, and configured to define a space, in which a process for the substrate is performed, together with the lower chamber, and the electromagnets may be mounted to the upper chamber and disposed above the adjustment plates, respectively.

In an embodiment, the substrate processing apparatus may further include a diffusion plate installed in the buffer space to divide the buffer space into a divided space and a diffusion space and including a plurality of diffusion holes configured to allow the divided space and the diffusion space to communicate with each other, and the diffusion plate may include a partition that protrudes from a top surface thereof to divide the divided space into a plurality of spaces.

In an embodiment, the inflow holes may one-to-one correspond to the plurality of divided spaces, respectively.

In an embodiment, the inflow plate may have a resin-coated surface.

In an embodiments of the present invention, a showerhead includes: a showerhead main body including an inner space to which a reaction gas is supplied from the outside and a plurality of injection holes configured to inject the reaction gas while communicating with the inner space; an inflow plate installed in the inner space to divide the inner space into an inflow space and a buffer space and including a plurality of inflow holes configured to allow the inflow space and the buffer space to communicate with each other; and a plurality of adjustment plates installed on the inflow holes in a movable manner, respectively, and configured to restrict movement of the reaction gas from the inflow space to the buffer space on the basis of a distance spaced from the inflow plate according to the movement.

Advantageous Effects

According to an embodiment of the present invention, the movement of the reaction gas through the inflow hole may be restricted by moving the adjustment plate, and, through this, the supply amount of the reaction gas may be adjusted for each portion of the substrate.

Also, since the adjustment plate may be remotely moved through the electromagnet from the outside of the chamber, the process uniformity may be easily adjusted without opening the chamber or releasing the inner vacuum of the chamber.

BEST MODE

Hereinafter, exemplary embodiments of the present invention will be described in more detail with reference to FIGS. 1 to 8. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration.

Although a deposition apparatus is exemplarily described below, embodiments of the present invention are not limited thereto. For example, the present invention may be applied to various processes for processing a substrate by using a reaction gas.

Figure 1:
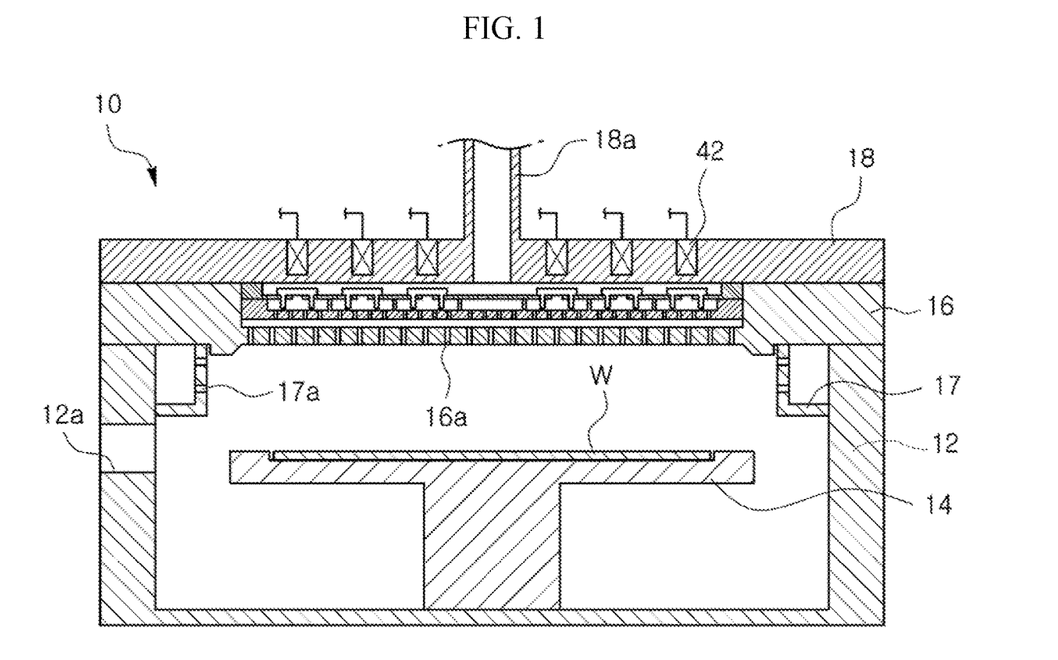
FIG. 1 is a schematic cross-sectional view illustrating a substrate processing apparatus according to an embodiment of the present invention.

FIG. 1 is a schematic cross-sectional view illustrating a substrate processing apparatus according to an embodiment of the present invention. As illustrated in FIG. 1, a substrate processing apparatus 10 includes a lower chamber 12 and an upper chamber 18. The lower chamber 12 has an opened upper portion and a passage 12a through which a substrate W is loaded and unloaded. The substrate W may be loaded into the lower chamber 12 through the passage 12a, and a gate valve (not shown) may be installed on an outer portion of the passage 12a to open or close the passage 12a.

The upper chamber 18 closes or opens the opened upper portion of the lower chamber 12. When the upper chamber 18 closes the opened upper portion of the lower chamber 12, the lower chamber 12 and the upper chamber 18 define an inner space that is closed from the outside. The upper chamber 18 includes a gas supply hole 18a communicating with an inner space of a shower head main body 16, and a reaction gas is supplied into the inner space through the gas supply hole 18a.

A susceptor 14 is installed in the lower chamber 12, and the substrate W is disposed on the susceptor 14. The susceptor 14 may include a heater (not shown), and the heater may heat the substrate W at a processing temperature through a current applied from an external power.

Figure 2:
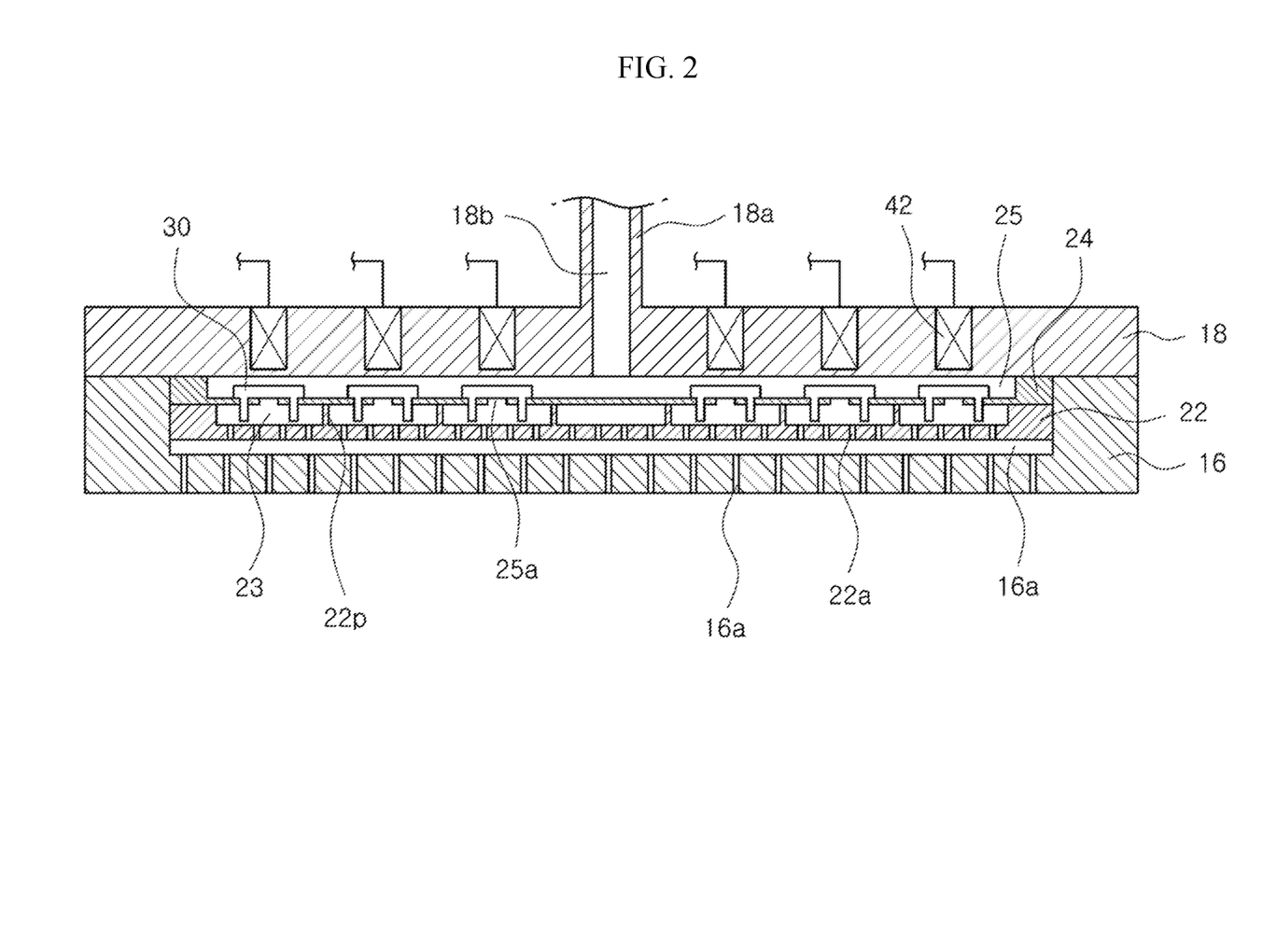
FIG. 2 is a schematic cross-sectional view illustrating an upper chamber and a shower head in FIG. 1.

FIG. 2 is a schematic cross-sectional view illustrating the upper chamber and the showerhead in FIG. 1. The showerhead includes a showerhead main body 16, a diffusion plate 22, and an inflow plate 24. The showerhead main body 16 is connected to a lower portion of the upper chamber 18 and includes an injection part having a plate shape and a flange part installed outside the injection part and fixed to the upper chamber 18. The injection part is spaced apart from the upper chamber 18, and an inner space is defined between the upper chamber 18 and the flange part. The injection part includes a plurality of injection holes 16a, and the reaction gas supplied into the inner space is injected toward the substrate W through the injection holes 16a. The reaction gas may include hydrogen ($H_2$), nitrogen ($N_2$), or other predetermined inert gases, and may also include precursor gases such as silane ($SiH_4$) or dichlorosilane ($SiH_2Cl_2$). Furthermore, the reaction gas may include diborane ($B_2H_6$) or phosphine ($PH_3$).

The reaction gas reacts with the substrate W to perform a process and then is exhausted to the outside through an exhaustion ring 17. The exhaustion ring 17 includes a plurality of exhaustion holes 17a, and the reaction gas is moved into the exhaustion ring 17 through the exhaustion holes 17a and then exhausted to the outside. The exhaustion pump (not shown) may be provided to forcedly exhaust the reaction gases.

Figure 3:
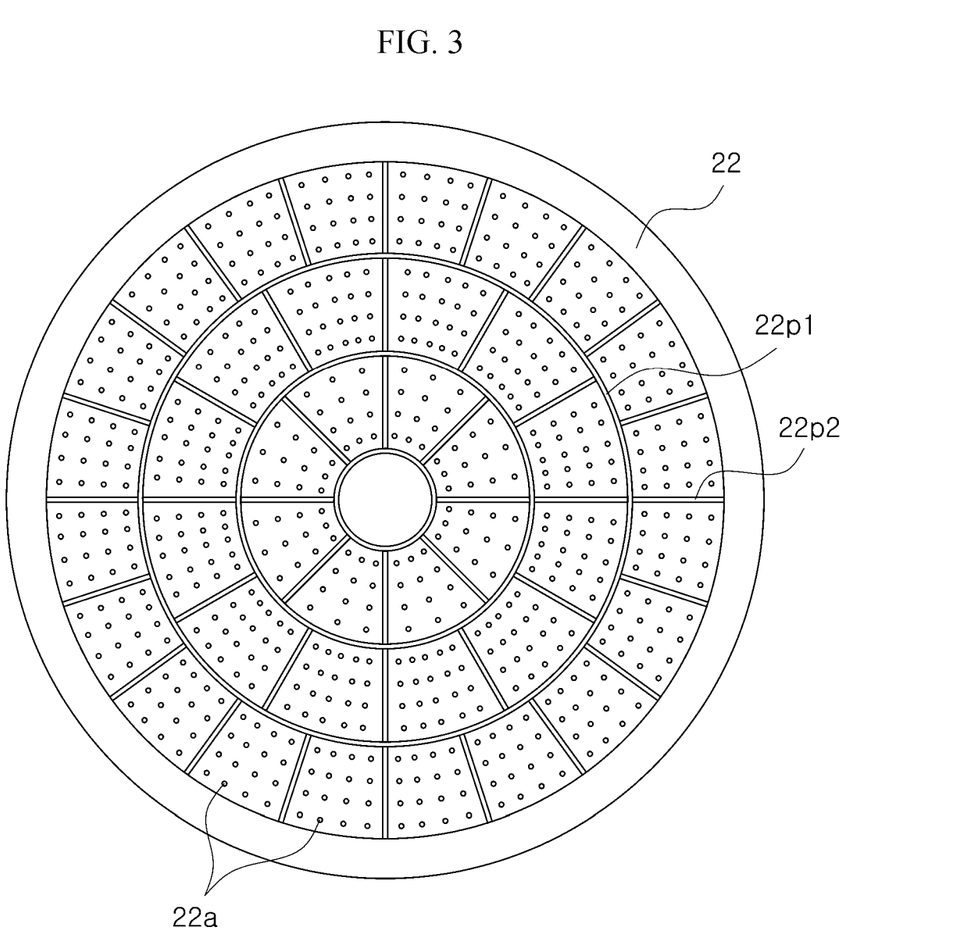
FIG. 3 is a schematic plan view illustrating a diffusion plate in FIG. 2.

FIG. 3 is a schematic plan view illustrating a diffusion plate in FIG. 2. As illustrated in FIG. 2, the diffusion plate 22 includes a diffusion part having a plate shape and a flange part installed on an outer portion of the diffusion plate and fixed to an inflow plate that will be described later. The diffusion part is spaced apart from the inflow plate 24, and a divided space 23 is defined between the inflow plate 24 and the diffusion part. The diffusion part includes a plurality of diffusion holes 22, and the reaction gas supplied to the divided space 23 is injected to the diffusion space 16b disposed therebelow through the diffusion holes 22a.

Here, as illustrated in FIG. 3, the divided space 23 is divided into a plurality of spaces by a plurality of partitions 22p1 and 22p2. A circular partition 22p1 has a concentric circle shape with respect to a center of the diffusion plate 22 and divides the divided space 23 along a radial direction. Radial partitions 22p2 are radially arranged with respect to the center of the diffusion plate 22 to divide the divided space 23 along a circumferential direction. Unlike the embodiment, the divided space 23 may be more or less divided.

Figure 4:
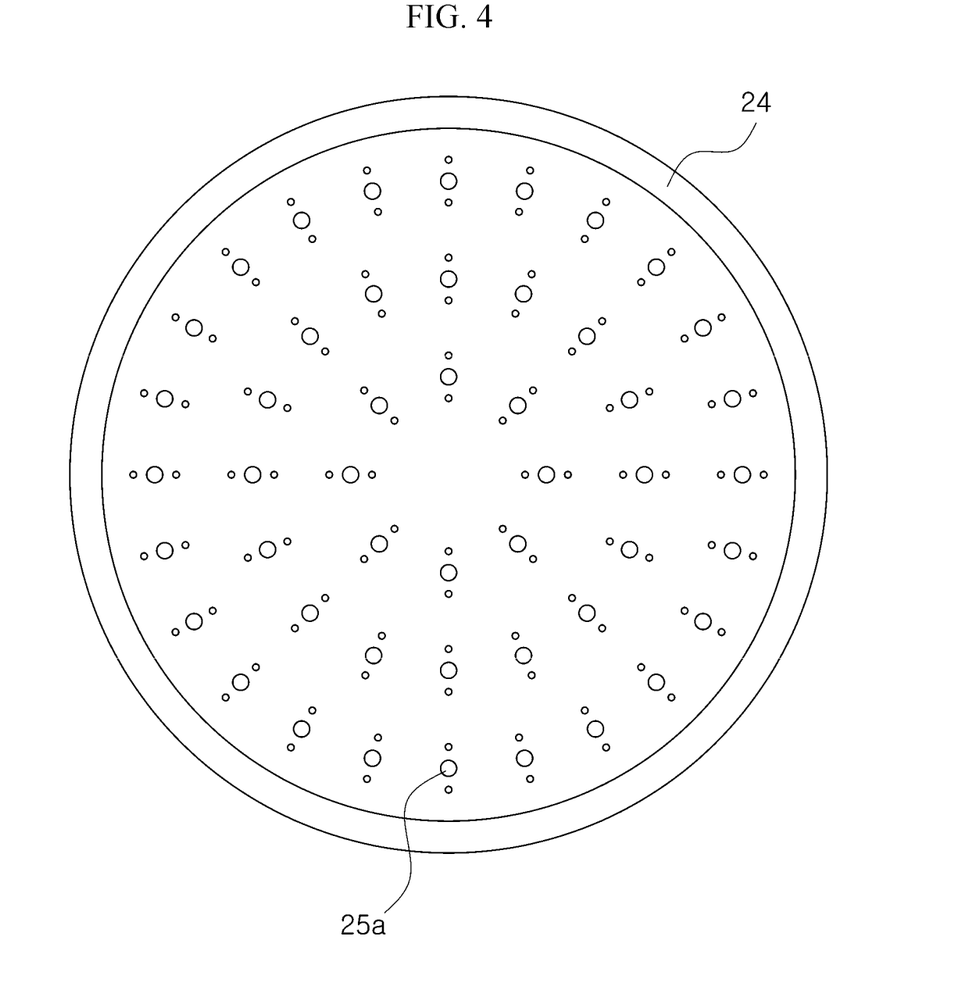
FIG. 4 is a schematic plan view illustrating an inflow plate in FIG. 2.

FIG. 4 is a schematic plan view illustrating the inflow plate in FIG. 2. As illustrated in FIG. 2, the inflow plate 24 includes an inflow part having a plate shape and a flange part installed on an outer portion of the inflow part and fixed to the upper chamber 18 that will be described later. The inflow part is spaced apart from the upper chamber 18, and an inflow space 25 is defined between the upper chamber 18 and the inflow part. The inflow part may include a plurality of inflow holes 25a, and the reaction gas supplied to the inflow space 25 may be moved to the divided space 23 disposed therebelow through the inflow holes 25a.

Here, as illustrated in FIG. 2, an adjustment plate 30 may be installed on the inflow holes 25a to restrict movement of the reaction gas. As illustrated in FIG. 4, the inflow part includes a guide hole defined in each of both sides of the inflow hole 25a, and the adjustment plate 30 includes a pair of guide bars that protrude from a bottom surface thereof. Each of the guide bars is inserted into the guide hole and is moved along the guide hole when the adjustment plate 30 is moved.

Figure 5:
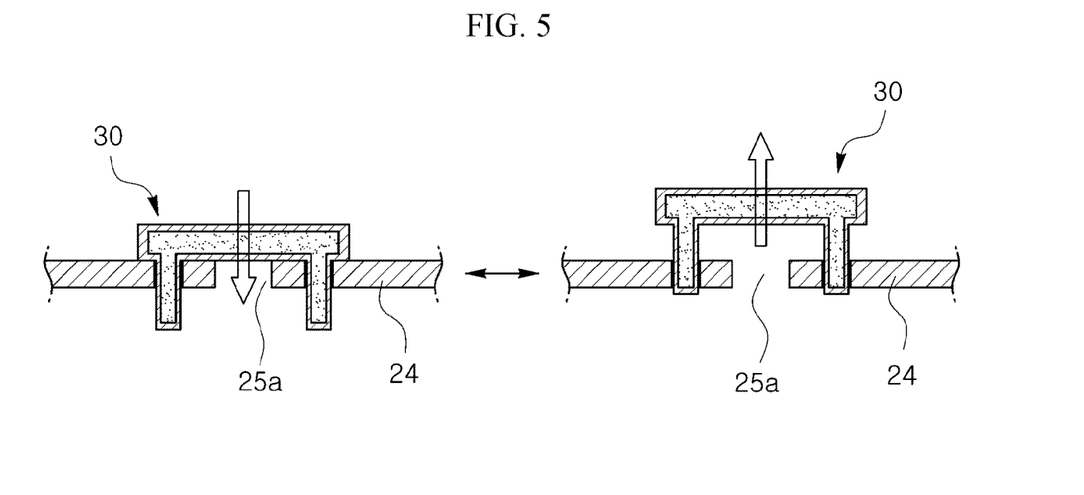
FIG. 5 is a cross-sectional view illustrating movement of an adjustment plate in FIG. 2.
Figure 6:
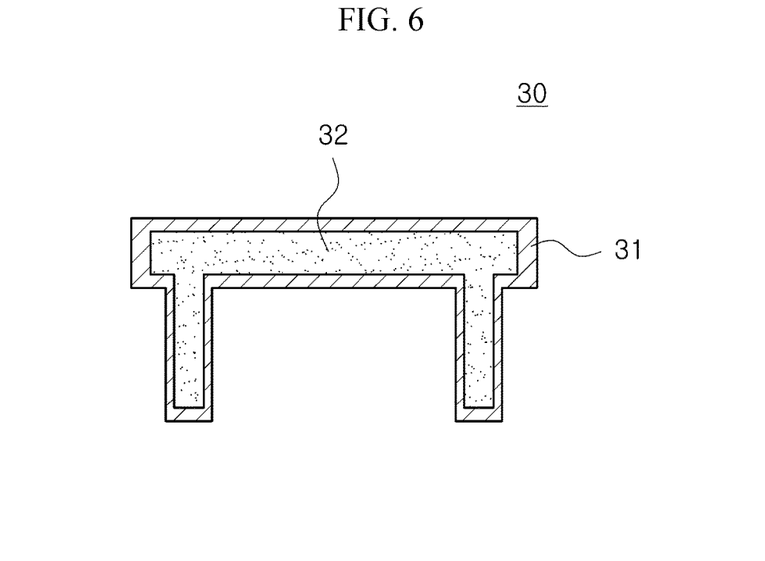
FIG. 6 is a cross-sectional view illustrating the adjustment plate in FIG. 2.

FIG. 5 is a cross-sectional view illustrating the movement of the adjustment plate in FIG. 2, and FIG. 6 is a cross-sectional view illustrating the adjustment plate in FIG. 2. The adjustment plate 30 may be installed on the inflow hole 25a in a vertically movable manner, and when the adjustment plate 30 ascends to be spaced apart from the inflow hole 25a or the inflow plate 24, the reaction gas may be moved into the divided space 23 through the inflow hole 25a. On the other hand, when the adjustment plate 30 descends to be adjacent to the inflow hole 25a or the inflow plate 24, the reaction gas may not be moved into the divided space 23 through the inflow hole 25a. Here, the guide bar is moved along the guide hole, and the adjustment plate 30 ascends or descends along a preset path.

As illustrated in FIG. 6, the adjustment plate 30 includes a main body 32 made of a material that responses to a magnetic force and a coating layer 31 that covers the main body 32. As described below, as a magnetic force is applied through an electromagnet, the adjustment plate 30 may ascend or descend, and the main body 32 may respond to the magnetic force like metal. Also, the coating layer 32 is necessary to cover the main body 32 so as to prevent the main body 32 from being contaminated or oxidized and maintain sealing of the inflow hole 25a while being adjacent to the inflow hole 25a and the inflow plate 24.

Figure 7:
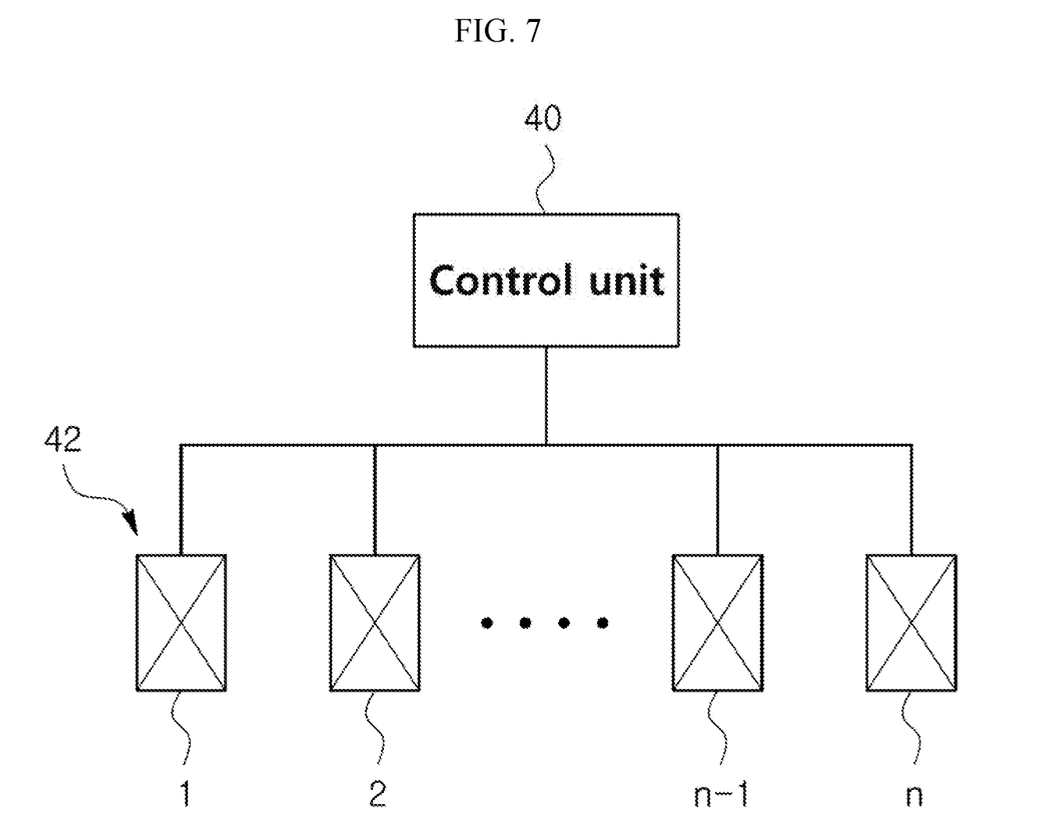
FIG. 7 is a block diagram illustrating a state in which each of electromagnets in FIG. 2 is connected to a control unit.
Figure 8:
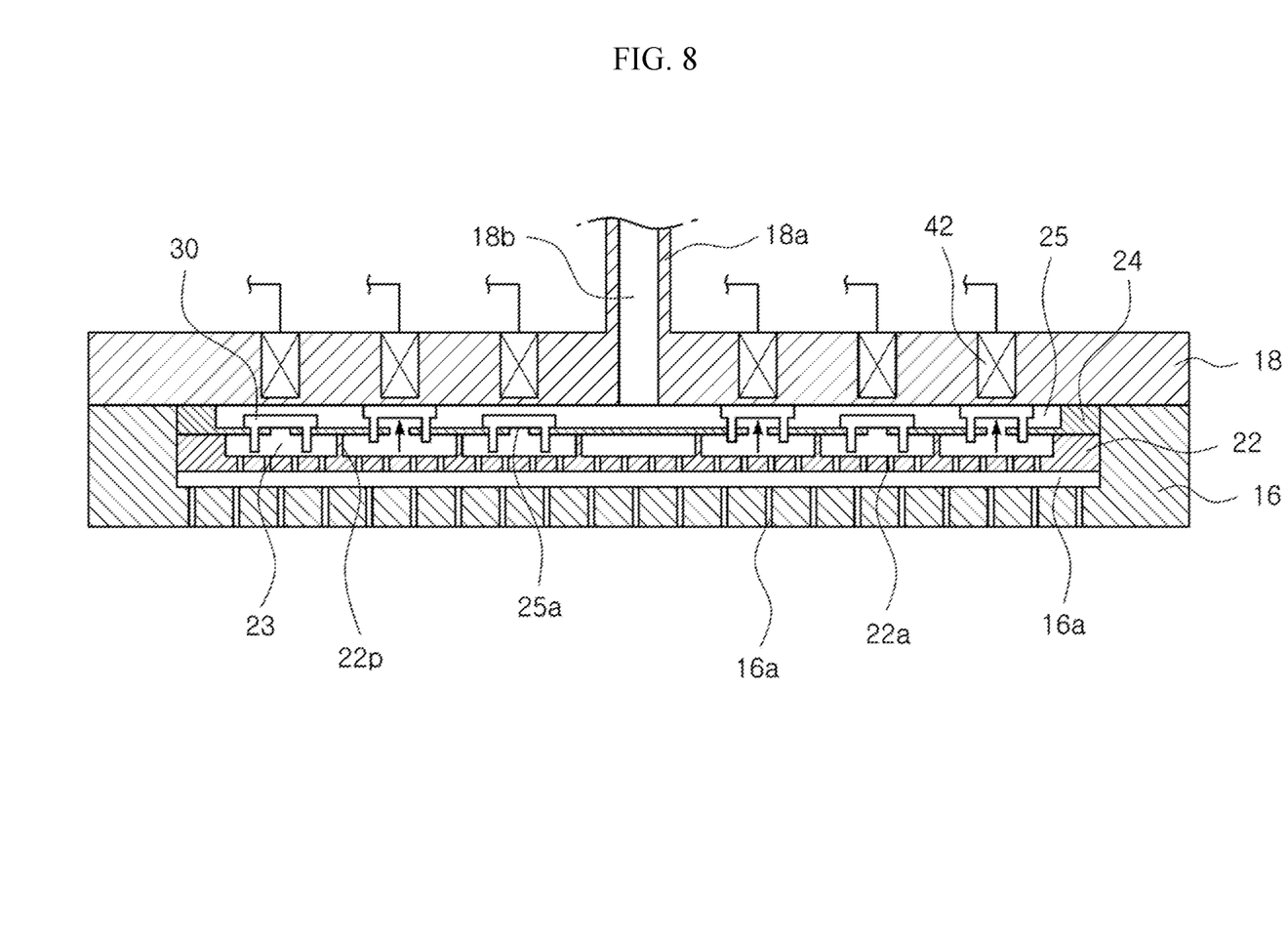
FIG. 8 is a cross-sectional view illustrating an operation state of a showerhead in FIG. 2.

FIG. 7 is a block diagram illustrating a state in which each of the electromagnets in FIG. 2 is connected to the control unit, and FIG. 8 is a cross-sectional view illustrating an operation state of the showerhead in FIG. 2. As illustrated in FIG. 2, the adjustment plates 30 may one-to-one correspond to the electromagnets 42, respectively, and ascend through the electromagnets 42. However, unlike the embodiment, each of the adjustment plates 30 may ascend or descend through a different unit.

In particular, each of the electromagnets 42 may be provided in plurality (1, 2, 3, . . . , n−1, n, n is an integer) and mounted to the upper chamber 18 while being disposed above the adjustment plate 30. The control unit 40 may be connected to each of the electromagnets 42 and apply a power to or block the applied power from each of the electromagnets 42. Accordingly, as illustrated in FIG. 8, when the power is applied, the adjustment plate 30 may ascend by the electromagnet 42 and is spaced apart from the inflow hole 25a or the inflow plate 24, and the reaction gas may be moved to the divided space 23 through the inflow hole 25a. When the power is blocked, the adjustment plate 30 may descend to be adjacent to the inflow hole 25a or the inflow plate 24, and the reaction gas may not be moved to the divided space 23 through the inflow hole 25a.

Hereinafter, a flow of the reaction gas will be described below with reference to FIGS. 7 and 8.

Firstly, the injected reaction gas is provided to an upper portion of the substrate W, and, in a state in which the substrate W is heated by the susceptor 14, the reaction gas reacts with a surface of the substrate W to form a thin-film. Here, the thin-film has a thickness that is proportional to a supply amount of the reaction gas injected from the above through injection holes 16a. In the surface of the substrate W, a portion to which a small amount of reaction gas is supplied has a small thickness of the thin-film, and a portion to which a large amount of reaction gas is supplied has a great thickness of the thin-film. Accordingly, when the reaction gas is uniformly supplied to the entire surface of the substrate W, the thin-film may have a uniform thickness.

However, the thickness of the thin-film is proportional to a heating temperature of the susceptor 14 in addition to the supply amount of the reaction gas. Also, in the surface of the substrate W, a portion in which the heating temperature is low has a small thickness of the thin-film, and a portion in which the heating temperature is high has a great thickness of the thin-film. Accordingly, when the heating temperature of the susceptor 14 is uniform, the thin-film may have a uniform thickness. Thus, the susceptor 14 is preferred to have a uniform heating temperature over entire areas thereof.

However, the susceptor 14 having a completely uniform heating temperature is substantially impossible to be processed. In particular, as the substrate W has recently increased in size, the susceptor 14 also increases in size, and accordingly a uniform temperature distribution is difficult to be formed on the substrate W. That is, while the substrate W is heated to the processing temperature, the heater may be broken, performance of the heater may be degraded, or radiant heat of the heater may be locally ununiformed. Besides, various factors affecting the thickness of the thin-film exist. In order to form the thin-film having a uniform thickness, a portion of the above-described factors are necessary to be artificially adjusted. Thus, in an embodiment of the present invention, as the supply amount of the reaction gas is artificially adjusted to be ununiformed, the thin-film having a uniform thickness may be formed.

For example, the thin-film is formed by using a dummy substrate W, and then the thickness of the thin-film is measured. Here, the same amount of the reaction gas with respect to a surface area may be injected to each area of a surface of the substrate W by adjusting the supply amount of the reaction gas supplied to each portion of the substrate W. Thereafter, the supply amount of the reaction gas supplied to each portion may be adjusted in proportion to the measured thickness of the thin-film. That is, when the thickness of the thin-film at a specific area of the surface of the substrate W is greater than a reference value, as the adjustment plate 30 disposed above the corresponding area descends to restrict movement of the reaction gas through the inflow hole 25a, the supply amount of the reaction gas may decrease. On the other hand, when the thickness of the thin-film at a specific area of the surface of the substrate W is less than the reference value, as the adjustment plate 30 disposed above the corresponding area ascends to allow the movement of the reaction gas through the inflow hole 25a, the supply amount of the reaction gas may increase. The above-described control unit 40 may control the electromagnet 42 on the basis of the measured thickness of the thin-film to increase or decrease the amount of the reaction gas supplied to each portion. For example, the above-described reference value may be a mean value of the measured thicknesses of the thin-films, and the control unit may calculate the mean value from the measured thicknesses of the thin-films. When an adjustment process is performed several times through the above-described method, the thin-film having a uniform thickness may be formed, and thereafter, the adjustment process may be applied to an actual process Although the present invention is described in detail with reference to the exemplary embodiments, the invention may be embodied in many different forms. Thus, technical idea and scope of claims set forth below are not limited to the preferred embodiments.

INDUSTRIAL APPLICABILITY

The present invention may be applicable to a various apparatus for manufacturing semiconductor or a various method for manufacturing semiconductor.

The invention claimed is:

1. A substrate processing apparatus comprising:
a chamber in which a process for a substrate is performed;
a showerhead installed in the chamber to inject a reaction gas toward the substrate; and
a susceptor installed below the showerhead to support the substrate,
wherein the showerhead comprises:
a showerhead main body comprising an inner space to which the reaction gas is supplied from the outside and a plurality of injection holes configured to inject the reaction gas while communicating with the inner space, the showerhead main body having a guide hole defined in at least one of sides of an inflow hole;
an inflow plate installed in the inner space to divide the inner space into an inflow space and a buffer space disposed below the inflow space, the inflow plate comprising a plurality of inflow holes configured to allow the inflow space and the buffer space to communicate with each other;
a plurality of adjustment plates installed on the inflow holes, respectively, the adjustment plates being able to move up and down; and
a plurality of electromagnets each configured to apply a magnetic force to an adjustment plate of the plurality of adjustment plates to move the adjustment plate up or down, so that a supply amount of the reaction gas through an inflow hole of the plurality of inflow holes is adjusted,
wherein the adjustment plate comprises a guide bar that is inserted into the guide hole while protruding from one surface of the adjustment plate, which faces the inflow plate, and configured to be moved along the guide hole when the adjustment plate is moved,
wherein the inflow holes are spread across an entire surface of the inflow plate.

2. The substrate processing apparatus of claim 1, wherein the substrate processing apparatus further comprises an exhaustion ring disposed between the showerhead and the susceptor, the reaction gas being exhausted through a plurality of exhaustion holes of the exhaustion ring after reacting with the substrate.

3. The substrate processing apparatus of claim 1, wherein the adjustment plate ascends due to the magnetic force of the electromagnet after applying a power to the electromagnet and the adjustment plate descends due to a weight of the adjustment plate after blocking the applied power from the electromagnet.

4. The substrate processing apparatus of claim 3, wherein the chamber comprises:
a lower chamber having an opened upper portion; and
an upper chamber installed on the showerhead to define the inner space and open and close the upper portion of the lower chamber, and configured to define a space, in which a process for the substrate is performed, together with the lower chamber,
wherein the electromagnets are mounted to the upper chamber and disposed above the adjustment plates, respectively.

5. The substrate processing apparatus of claim 1, further comprising a diffusion plate installed in the buffer space to divide the buffer space into a divided space and a diffusion space and comprising a plurality of diffusion holes configured to allow the divided space and the diffusion space to communicate with each other,
wherein the diffusion plate comprises a partition that protrudes from a top surface thereof to divide the divided space into a plurality of divided spaces.

6. The substrate processing apparatus of claim 5, wherein the inflow holes one-to-one correspond to the plurality of divided spaces, respectively.

7. The substrate processing apparatus of claim 1, wherein the inflow plate has a resin-coated surface.

8. A showerhead comprising:
a showerhead main body comprising an inner space to which a reaction gas is supplied from the outside and a plurality of injection holes configured to inject the reaction gas while communicating with the inner space;
an inflow plate installed in the inner space to divide the inner space into an inflow space and a buffer space and comprising a plurality of inflow holes configured to allow the inflow space and the buffer space to communicate with each other; and
a plurality of adjustment plates installed on the inflow holes, respectively, the adjustment plates being able to move up and down; and
a plurality of electromagnets each configured to apply a magnetic force to an adjustment plate of the plurality of adjustment plates to move the adjustment plate up or down, so that a supply amount of the reaction gas through the inflow hole is adjusted,
wherein the adjustment plate comprises a guide bar that is inserted into the guide hole while protruding from one surface of the adjustment plate, which faces the inflow plate, and configured to be moved along the guide hole when the adjustment plate is moved,
wherein the inflow holes are spread across an entire surface of the inflow plate.

9. The showerhead of claim 8, wherein the supply amount of the reaction gas through the inflow hole increases due to an ascent of the adjustment plate.

10. The showerhead of claim 8, the adjustment plate ascends due to the magnetic force of the electromagnet after applying a power to the electromagnet and the adjustment plate descends due to a weight of the adjustment plate after blocking the applied power from the electromagnet.

* * * * *